United States Patent [19]
Ward et al.

[11] Patent Number: 5,594,700
[45] Date of Patent: Jan. 14, 1997

[54] SEQUENTIAL MEMORY

[75] Inventors: Morris D. Ward, Garland; Kenneth L. Williams, Richardson, both of Tex.

[73] Assignee: Texas Instruments Incorporated, Dallas, Tex.

[21] Appl. No.: 192,755

[22] Filed: Feb. 7, 1994

Related U.S. Application Data

[63] Continuation of Ser. No. 628,279, Dec. 17, 1990, abandoned.

[51] Int. Cl.[6] ............................ G11C 7/00; G11C 8/04
[52] U.S. Cl. ............................ 365/230.03; 365/189.01; 365/189.05; 365/221; 365/230.08; 365/239
[58] Field of Search ...................... 365/230.03, 221, 365/230.09, 239, 240, 189.05, 230.08, 189.01

[56] References Cited

U.S. PATENT DOCUMENTS

| | | | |
|---|---|---|---|
| 4,864,543 | 9/1989 | Ward et al. | 365/221 |
| 4,888,741 | 12/1989 | Malinowski | 365/230.05 |
| 4,922,457 | 5/1990 | Mizukami | 365/221 X |
| 4,954,987 | 9/1990 | Auvinen et al. | 365/189.02 |
| 5,012,408 | 4/1991 | Conroy | 365/230.03 X |
| 5,027,326 | 6/1991 | Jones | 365/230.03 X |
| 5,029,142 | 7/1991 | Ando | 365/230.03 X |
| 5,036,493 | 7/1991 | Nielsen | 365/230.03 |
| 5,255,242 | 10/1993 | Ward et al. | 365/230.03 |

FOREIGN PATENT DOCUMENTS

| | | |
|---|---|---|
| 0260897 | 3/1988 | European Pat. Off. . |
| 0272869 | 6/1988 | European Pat. Off. . |
| 2232797 | 12/1990 | United Kingdom . |

OTHER PUBLICATIONS

IBM Technical Disclosure Bulletin, vol. 30, No. 12, May 1988, pp. 339–341, "Increasing Data Read Rate From Memories".

*Primary Examiner*—Do Hyun Yoo
*Attorney, Agent, or Firm*—W. James Brady, III; Richard L. Donaldson

[57] ABSTRACT

A sequential memory (10) uses interleaved memories (12a–b) with associated output buffers (22a–b) to accomplish high data rates. Data access control circuitry (18) and bank select circuitry (20) control the order in which the memory banks (12a–b) are written to and read from. Output buffer circuits (22a–b) allow a data word to be read instantaneously after it is written to the sequential memory (10).

5 Claims, 2 Drawing Sheets

SEQUENTIAL MEMORY

This application is a continuation of application Ser. No. 07/628,279, filed Dec. 17, 1990, now abandoned.

RELATED APPLICATIONS

This application is related to U.S. patent application Ser. No. 628,316, filed Dec. 17, 1990, by Ward et al., entitled "Sequential Memory", now U.S. Pat. No. 5,255,342, and U.S. patent application Ser. No. 442,100, by Tai et al, filed Nov. 28, 1989, entitled "Data Access Controller and Method", now abandoned.

TECHNICAL FIELD OF THE INVENTION

This invention relates in general to electronic circuits, and more particularly to a sequential memory circuit.

BACKGROUND OF THE INVENTION

Sequential memories, such as FIFOs and LIFOs, are often used as a buffer between two circuits. These memories are referred to as a "sequential" because data is output in a predetermined sequence corresponding to the order in which it is was input. Sequential memories allow equipment operating at different input/output speeds to communicate with one another. Early sequential memories comprised shift registers which serially stored incoming data units at a desired speed and read out the stored data units at a different speed. Generally, shift register implementations of sequential memories are of limited storage and have unacceptable delay times, and therefore are unsuitable for many operations. More recently, random access memories have been developed in which pointers are used to implement the first-in, first-out or last-in, last-out I/O sequence.

While CMOS SRAM implementations are widely used, it would be desirable to increase the data rate at which a single sequential memory can operate. In CMOS SRAMs, a write to memory involves three distinct operations. First, the write bitlines are precharged to one of the voltage rails (normally $V_{cc}$), after which the precharge is disabled. The two bitlines (D and $\overline{D}$) are pulled to $V_{cc}$ and ground, or vice versa, depending upon the value to be written to the memory. Finally, the wordline and column select of the cell to be written to are pulsed to complete the write operation to the selected cell.

Importantly, all of the write bitlines are precharged between writing. Precharging the bitlines is thus a power-consuming operation. Also, every cell which has a common wordline with the cell being written to is selected. Data stored in these cells are not overwritten, however, because the respective bitlines are not selected by the column select, and therefore, are still at the rail. Precharging the bitlines creates a high current situation due to the large number of cells that are pulsed. The operations for reading from the memory are very similar to the operations for writing to the memory, and therefore exhibit similar power losses due to the nature of the CMOS RAM cell.

To reduce the power consumption problems, a designer will normally resort to a block select architecture to reduce bitline length (which typically improves access time) and wordline length. The SRAM is thus divided into two or more separate arrays; once the first array is full, writing begins on the second array, and so on. Naturally, there is a trade-off between the number of blocks and the level of multiplexing necessary to combine the blocks together.

Nonetheless, because of the three operations needed to read to or write from a memory cell, the data rate of the sequential memory is limited. Typically, a write operation requires about ten nanoseconds to perform the write and to recover from the write (i.e., to precharge the write bitlines to one of the voltage rails to prepare for the next write). Thus, improvements to the speed of the sequential memory are more or less tied to improvements made to the speed of CMOS SRAM arrays.

Therefore, there is a need to provide a sequential memory having a high data rate using available technology.

SUMMARY OF THE INVENTION

In accordance with the present invention, a sequential memory method and apparatus is provided which substantially eliminates or prevents the disadvantages and problems associated with prior sequential memories. The sequential memory of the present invention comprises a plurality of memories each operable to store data units. Write control circuitry is provided for writing incoming words to successive memories. Read control circuitry is provided for reading data units from successive memories in a predetermined sequence. A plurality of high-speed latches associated with respective memories latches an incoming data unit to be stored in the respective memory, if the incoming data unit could be accessed by the next read operation on the respective memory.

The present invention provides several advantages over the prior art. The effective transfer rate of READ and WRITE operations is greatly increased because of the interleave structure of the sequential memory. Further, because the next data unit to be read from a respective memory is stored in the associated latch, the data unit is available for reading immediately after it is received by the sequential memory.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
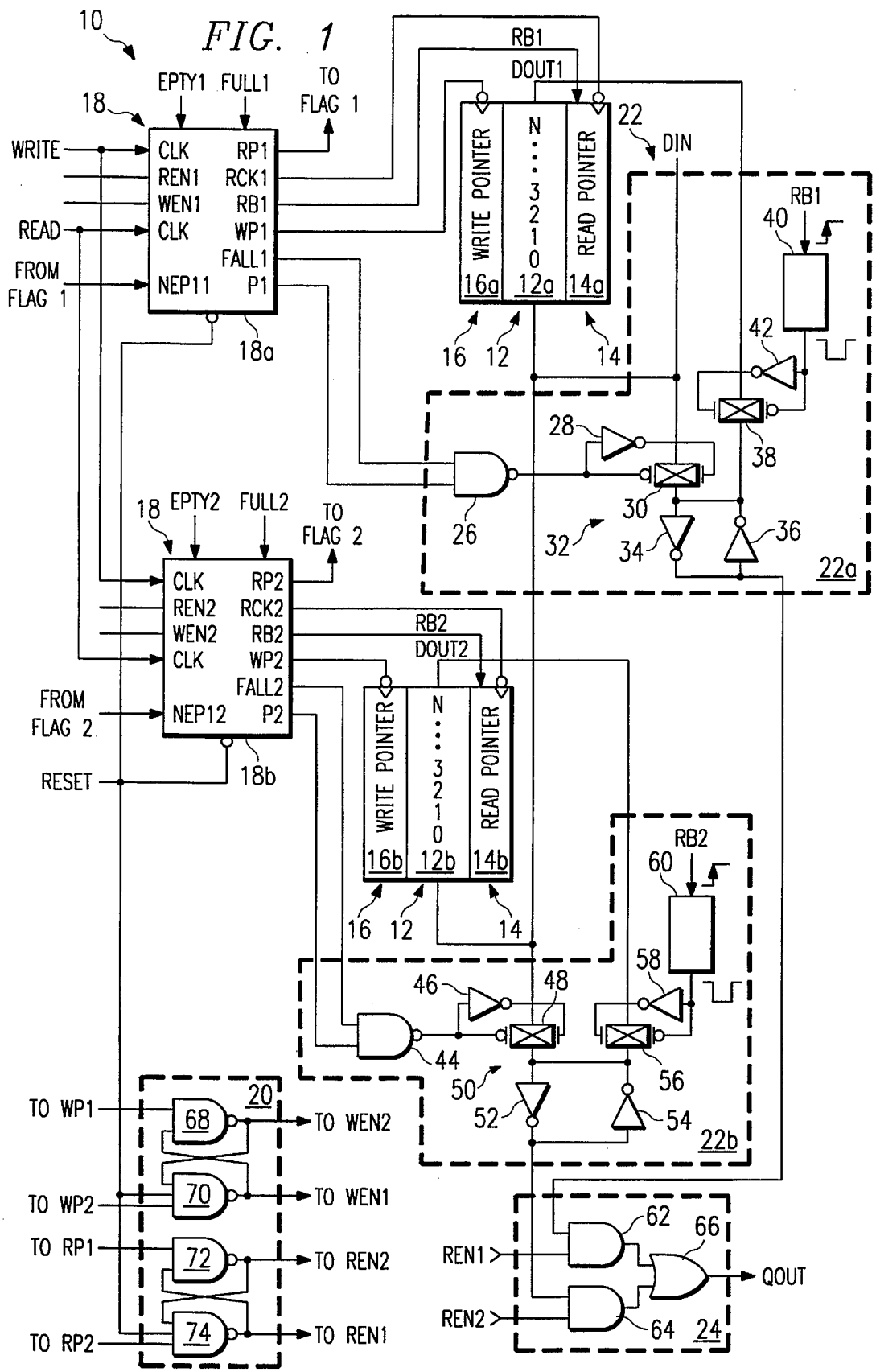
FIG. 1 illustrates a preferred embodiment of a FIFO memory.
Figure 2:
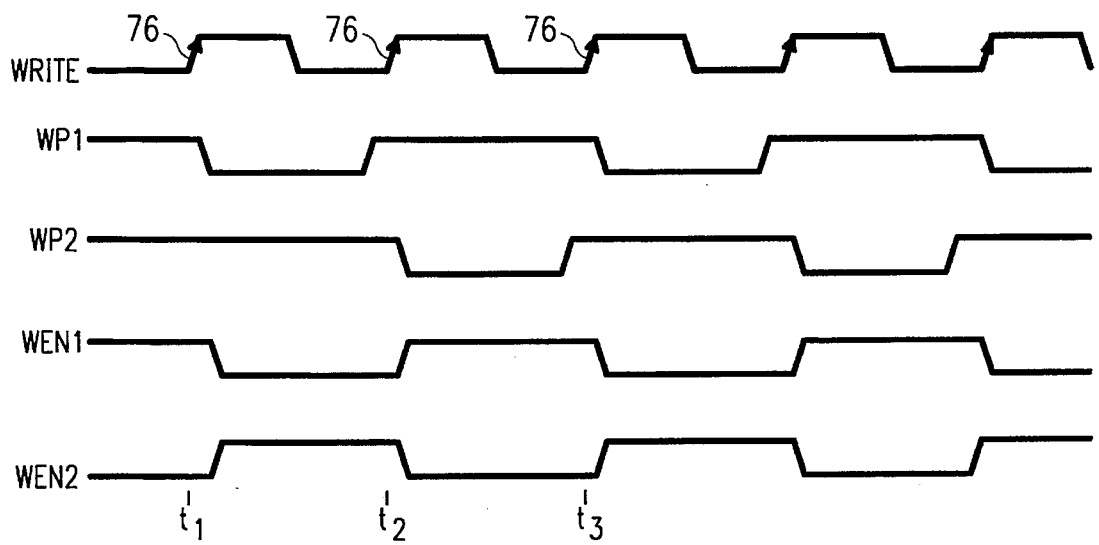
FIG. 2 illustrates timing diagrams associated with the circuit of FIG. 1.

The preferred embodiment of the present invention and its advantages are best understood by referring to FIGS. 1–3 of the drawings, like numerals being used for like and corresponding parts of the various drawings.

FIG. 1 illustrates a schematic representation of a preferred embodiment of a sequential memory. The sequential memory 10 comprises memory banks 12, individually denoted as memory banks 12a–b. Each memory bank 12 comprises N memory cells. Each memory cell is operable to store a data unit. In the illustrated embodiment, it is assumed that each memory cell comprises storage for a single bit; however, multiple bit data units could be provided as would be known to one skilled in the art. Each memory bank 12 has associated read pointer circuitry 14, individually referenced as read pointer circuits 14a and 14b, and write pointer circuitry 16, individually referenced as write pointer circuitry 16a and 16b. The read pointer circuitry 14 maintains a pointer indicating the next memory cell to be read from the associated memory, and write pointer circuitry 16 maintains a pointer indicative of the next cell available to store incoming data. Further, the pointer circuits 14a–b and 16a–b include circuitry to generate signals to read and write the value present on the Data IN (DIN) signal to the appropriate address in memory 12 and to read the next word to be output.

Data access control circuits 18 (individually referenced as 18a–b) generates control signals responsive to control signals input to the sequential memory 10 and further responsive to internally generated control signals. Each data access control circuit 18 receives the READ and WRITE clock signals and RESET signal input to the sequential memory 10. Data access control circuit 18a receives REN1 and WEN1 signals from bank select circuitry 20 described hereinbelow. Data access control circuit 18b receives signals REN2 and WEN2 from bank select circuitry 20. Flag generation circuitry (not shown) generates EPTY1, FULL1 and NEP11 signals to data access control circuit 18a and EPTY2, FULL2 and NEP12 signals to data access control circuit 18b. EPTY1 indicates that memory 12a is empty and FULL1 indicates that memory 12a is full. NEP11 (not Empty+1) indicates that memory 12a has at least two locations available for reading. EPTY2, FULL2 and NEP12 indicate that same conditions for memory 12b.

Data access control circuit 18a generates read and write pulse signals, WP1 and RP1. WP1 is input to the write pointer circuit 16a and RP1 is input to the flag generation circuitry. WP1 and RP1 are pulses generated responsive to WRITE and READ, respectively. Further, data access control circuit 18a generates a read clock signal (RCK1) to the read pointer circuitry 14a, a RB1 signal to the read pointer circuitry 14a and a FALL1 signal and a P1 signal to output buffer control circuitry 22a. Similarly, data access control circuit 18b generates a WP2 signal to the write pointer circuitry 16b, an RP2 signal to the flag generation circuitry, a RCK2 signal to read pointer circuitry 14b, a RB2 signal to read pointer circuitry 14b, a FALL2 and P2 signals to output buffer control circuitry 22b. DIN is input to the memories 12a–b and to the output buffer control circuits 22a–b. A Data OUT signal (DOUT1) is output from the memory bank 12a and input to output buffer circuitry 22a. DOUT2 is output from memory bank 12b and input to output buffer circuit 22b.

RCK1 is a pulse generated responsive to the READ signal and is used to increment the pointers stored in read pointer circuit 14a. RB1 is a pulse generated responsive to the read clock, but only when data is to be read from the memory 12a to the output buffer circuit 22a. This aspect of the invention is described in greater detail hereinbelow. The FALL1 signal is a pulse generated to enable a "fall-through", i.e., to latch the value on DIN in output buffer 22a. This aspect of the invention is also discussed in greater detail hereinbelow. P1 is a delayed version of RB1 and is used to prevent fall-through when data is being read from memory 12a to output buffer circuit 22a. WP2, RP2, RCK2, RB2, FALL2 and P2 have the same functions with respect to memory 12b and output buffer 22b. Data access controllers are discussed in greater detail in connection with U.S. application Ser. No. 442,100, to Tai et al., entitled, "Data Access Controller and Method", filed Nov. 28, 1989, which is incorporated by reference herein.

Bank select circuitry 20 receives signals WP1, WP2, RP1 and RP2 from the data access control circuits 18a–b. Bank select circuit 20 outputs signals WEN1, WEN2, REN1 and REN2. These signals are coupled to the data access control circuits 18a–b and to output control circuit 24.

Output buffer control circuit 22a comprises a NAND gate 26 having inputs coupled to the FALL1 and P1 signals. The output of NAND gate 26 is coupled to the input of an inverter 28 and to the inverting control input of a transmission gate 30. The output of inverter control input 28 is connected to the noninverting control input of transmission gate 30. The DIN signal is coupled to the input of transmission gate 30. A latch 32 comprising inverters 34 and 36 is coupled to the output of transmission gate 30. A second transmission gate 38 has its inverting control input coupled to the output of a pulse generator 40, which receives control signal RB1 and generates a pulse responsive thereto to latch the DOUT1 signal into latch 32. The output of pulse generator 40 is also connected to inverter 42, which has its output coupled to the noninverting control input of the transmission gate 38. The DOUT1 signal is coupled to the input of transmission gate 38. The output of transmission gate 38 is coupled to the latch 32. The output of latch 32 is coupled to the output control circuitry 24. Similarly, the FALL2 and P2 signals are coupled to the inputs of NAND gate 44. The output of NAND gate 44 is coupled to the input of inverter 46 and to the inverting control input of transmission gate 48. The output of inverter 46 is connected to the noninverting control input of transmission gate 48. DIN is coupled to the input of transmission gate 48 and the output of transmission gate 48 is coupled to latch 50 comprised of inverters 52 and 54. The input to latch 50 is coupled to the output transmission gate 56 having a noninverting control input coupled to the output of an inverter 58 and inverting input coupled to the output of pulse generator 60. The DOUT2 signal is coupled to the input of transmission gate 56. The pulse generator 60 inputs signal RB2 and outputs to the input of inverter 58. The output of latch 50 is coupled to the output control circuitry 24. The output control circuitry 24 comprises two AND gates 62 and 64 having outputs coupled to an OR gate 66. AND gate 62 has the REN1 signal and the output of latch 32 coupled to its inputs and AND gate 64 has the REN2 signal and the output of latch 50 connected to its inputs. The output of the OR gate 66 comprises the output of the memory 10 (QOUT).

Bank select circuitry 20 comprises NAND gates 68, 70, 72 and 74. NAND gate 68 inputs the WP1 signal and the output of NAND gate 70. NAND gate 70 inputs the output of NAND gate 68, the WP2 signal and the RESET signal. NAND gate 72 inputs the RP1 signal and the output of NAND gate 74. NAND gate 74 inputs the RP2 signal, the output of NAND gate 72 and the RESET signal. The output of NAND gate 68 generates the WEN2 signal, the output of NAND gate 70 generates the WEN1 signal, the output of NAND gate 72 generates the REN2 signal and the output of NAND gate 74 generates the REN1 signal.

In many applications, the WRITE and READ signals are asynchronous. On the active edge of the WRITE signal (it will be assumed for illustrative purposes that the rising edge of the WRITE signal is the active edge), the value represented by the DIN signal is written into the next available memory location, so long as the memories 12 are not full. On the active edge of the READ signal (also assumed to be the rising edge), the next location to be read is output from the appropriate memory 12a or 12b on the DOUT1 or DOUT2 signals.

The EPTY1, FULL1, EPTY2, and FULL2 signals are generated by the flag generation circuitry and indicate whether the respective memory banks 12a–b are empty or full. Flag generation circuitry is described in connection with U.S. patent application Ser. No. 393,440, entitled "Programmable Status Flag Generator FIFO", to K. L. Williams, et al., filed Aug. 14, 1989 (Attorney Docket No. TI-14075), which is incorporated by reference herein. The RESET signal is received from external circuitry. When the RESET signal is a logical low, the data access control circuits 18 are initialized and the bank select circuitry 20 is set to the initial state with WEN1 and REN1 high and WEN2 and REN2 low.

The WEN1 and WEN2 signals indicate which memory is active (i.e., which memory will store the next incoming data unit). When WEN1 is high, memory 12a is active and when WEN2 is high, memory 12b is active. NAND gate 68 and 70 form a SR (SET-RESET) flip-flop. When WEN1 is high and WEN2 is low, the outputs of the NAND gates 68 and 70 will remain in this state until the WP1 signal is pulsed low. Similarly, with WEN2 at a logic high and WEN1 at a logic low, the outputs of the NAND gates 68 and 70 will remain unchanged until the WP2 signal is pulsed low. Hence, after a write to memory bank 12a, the WP1 signal is pulsed low by data access control circuit 18a, thereby causing the WEN2 signal to go high and the WEN1 signal to go low. After writing to memory bank 12b, data access control circuit 18b causes WP2 to pulse low, thereby forcing WEN1 high and WEN2 low. The operation of NAND gate 72 and 74 is identical to that of NAND gate 68 and 70; after a read from memory bank 12a, RP1 is pulsed low and after a read from memory bank 12b, RP2 is pulsed low.

The operation of the sequential memory 10 may be best illustrated in connection with FIG. 2 which shows clock signals for write operations to the sequential memory 10. On each active edge 76 of the WRITE signal, the value of the DIN signal is to be written to the memory indicated by the WEN1 and WEN2 signals. Hence, at $t_1$, the WRITE signal transitions high, causing WP1 to transition low. Since WEN1 is high at $t_1$, the data value on signal DIN is written to memory bank 12a. After WP1 is pulsed low, WEN1 transitions low and WEN2 transitions high preparing for the next write. Although memory bank 12a would not be prepared for another write operation until time $t_3$, the sequential memory 10 is operable to receive more data at times $t_2$. At this point, the WRITE signal transitions high causing the WP2 signal to pulse low. Hence, the data value at DIN at time $t_2$ is written into memory bank 12b. After WP2 pulses low, WEN1 transitions high and WEN2 transitions low preparing for the next write to memory bank 12a.

As can be seen, the sequential memory 10 may store data units at a rate twice as fast as that available for a non-interleaved memory architecture. The data rate could be further increased by interleaving additional memory banks. For example, if four memory banks 12 were available, four write operations could be performed in the time needed for a single memory bank to store a data unit and recover.

Similar to the write operations described above, the read operations can be performed by the sequential memory 10 of FIG. 1 at a data rate twice that of a non-interleaved memory. With additional data banks 12, the data transfer rate can be increased even further. In order to accommodate the increased data output rate, a I/O circuit comprised of output buffer control circuits 22a-b and output control circuit 24 is provided.

Figure 3A:
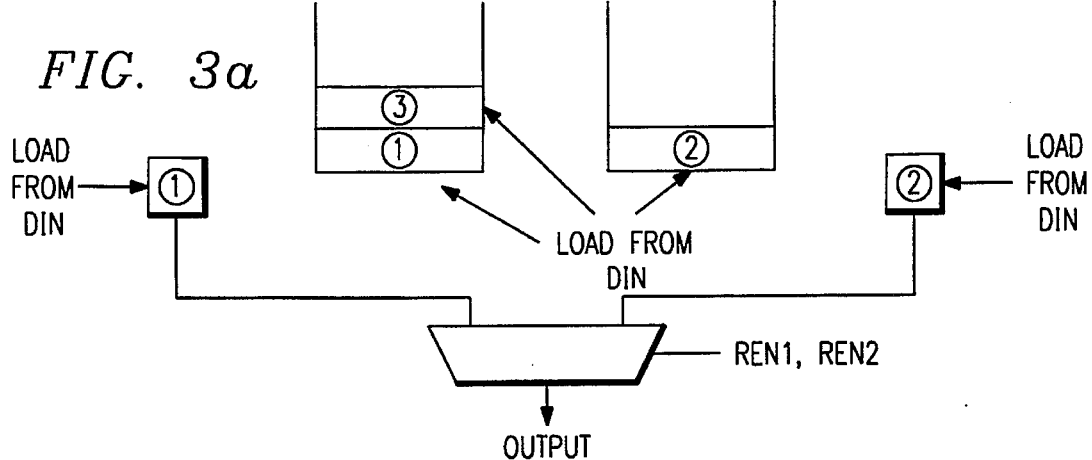
FIGS. 3a–b illustrate operation of a high-speed input/output circuit used in the preferred embodiment.
Figure 3B:
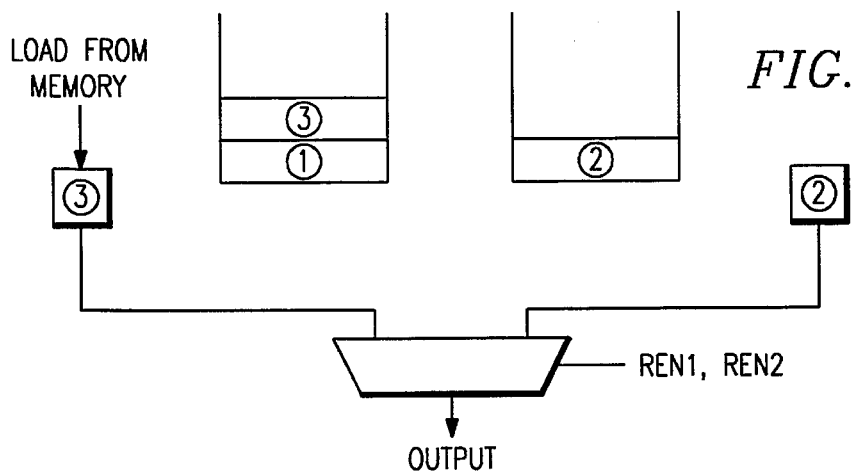

Referring to FIGS. 1 and 3a-b, the operation of the output buffer circuits 22 and output control circuit 24 is described. FIGS. 3a-b graphically illustrate how data is loaded into the output buffer circuits 22a-b for output through the output control circuit 24. If a memory 12a-b is empty, new data directed to such memory is stored in both the memory 12a or 12b and in the associated buffer circuit 22a (responsive to P1 and FALL1) or 22b (responsive to P2 and FALL2). Hence, assuming both memories 12a-b are initially empty, the first input data unit would be written into both memory 12a and into output buffer circuit 22a and the second input data unit would be written to both memory 12b and output buffer circuit 22b.

Since the output buffer circuits 22 are extremely high speed, the data will be latched therein much before the data is stored in the associated memory 12. If a third data unit was written to the sequential memory 10 prior to a read operation, the third data unit would be written to memory bank 12a (assuming the sequential memory 10 is a FIFO). The output circuitry reads from a selected one of the output buffer circuits 22a-b responsive to the REN1 and REN2 signals.

As shown in FIG. 3b, if a read operation occurs after the three write operations, the third data unit will be read from memory 12a via DOUT1 and stored in output buffer circuit 22a (responsive to RB1) at the same time that the output control circuit switches to output buffer 22b, preparing for the next read. Thus, when the output control circuit switches to output buffer circuit 22a for the next read, the proper data unit will be stored therein.

The advantage of the high speed output buffer circuits 22a-b is best understood by example. Assuming the memories 12a-b were initially empty, a first word would be stored in memory 12a and a second word would be stored in memory 12b. If the read and write operations were being performed at essentially the same speed, a read on the first word would occur before a write of the second word. However, the first word cannot be read from memory 12a until after the write operation on memory 12a is fully performed which, as described in FIG. 2, will not occur for some time after the second write operation. Similarly, the second word would not be available for reading from memory 12b until some time after the third write operation. However, the present invention provides high speed buffers which store the next word to be read from the associated memory 12a or 12b. Because the buffer circuits 22a-b can store a data value much faster than the memories 12a-b, the next data value to be output is always ready.

If the sequential memory 10 is a LIFO memory, then incoming data unit would be stored to the proper output buffer circuit 22 after each write operation. Upon reading the contents of an output buffer, that output buffer would receive data from the associated memory 12a or 12b.

The present invention provides significant advantages over the prior art. Because reading and writing operations are performed on interleaved memories, the data input and output transfer rates are significantly enhanced without resorting to faster transistor technologies which require additional power. Further, the output buffer circuits 22 allow a data unit to be read immediately after it is input to the sequential memory 10.

Although the present invention and its advantages have been described in detail, it should be understood that various changes, substitutions and alterations can be made herein without departing from the spirit and scope of the invention as defined by the appended claims.

What is claimed is:

1. A sequential memory comprising:

an input terminal for receiving incoming data units;

an output terminal;

a plurality of memories each operable to store data units, each memory coupled to said input terminal and having a first output;

write control circuitry for writing successive incoming data units to successive memories;

read control circuitry for reading data units from said memories in a predetermined pattern;

a plurality of high speed storage circuits associated with respective memories, each storage circuit having a first input coupling said input terminal to the input of a first transmission gate and a second input coupling the first output of a respective memory to the input of a second transmission gate, each of said first and second transmission gates having an output coupled to the input of a latch, said latch including a pair of inverters each inverter having an output coupled to the input of the other inverter, each high speed storage circuit selectively storing in said latch either an incoming data unit received at said first input or a data unit received at said second input in response to control signals selectively enabling one of said first and second transmission gates, each storage circuit having an output;

an output control circuit selectively coupling one of said outputs of said high-speed storage circuits to said output terminal.

2. The sequential memory of claim 1 and further comprising circuitry for selectively outputting the incoming data unit stored in one of said high speed storage circuits.

3. The sequential memory of claim 1 and further comprising circuitry to selectively transfer a data unit from one of said memories to its respective high speed storage circuit.

4. The sequential memory of claim 1 wherein said sequential memory comprises a first-in, first-out memory and wherein each of said high speed storage circuits includes control circuitry to latch incoming data unit if said respective memory is empty.

5. The sequential memory of claim 1 wherein said sequential memory comprises a last-in, first-out memory and each incoming data unit is stored in one of said high speed storage circuits.

* * * * *